(12) United States Patent
Kim et al.

(10) Patent No.: US 12,564,036 B2
(45) Date of Patent: Feb. 24, 2026

(54) INTEGRATED CIRCUIT DEVICES INCLUDING VIA STRUCTURES HAVING A NARROW UPPER PORTION, AND RELATED FABRICATION METHODS

(71) Applicant: Samsung Electronics Co., Ltd., Suwon-si (KR)

(72) Inventors: Tae Sun Kim, Ballston Spa, NY (US); Janggeun Lee, Delmar, NY (US); Jaemyung Choi, Niskayuna, NY (US); Kang-ill Seo, Albany, NY (US)

(73) Assignee: Samsung Electronics Co., Ltd., Suwon-si (KR)

( * ) Notice: Subject to any disclaimer, the term of this patent is extended or adjusted under 35 U.S.C. 154(b) by 606 days.

(21) Appl. No.: 17/880,554

(22) Filed: Aug. 3, 2022

(65) Prior Publication Data

US 2023/0352400 A1 Nov. 2, 2023

Related U.S. Application Data

(60) Provisional application No. 63/335,887, filed on Apr. 28, 2022.

(51) Int. Cl.
| | |
|---|---|
| *H01L 23/522* | (2006.01) |
| *H01L 21/768* | (2006.01) |
| *H01L 23/532* | (2006.01) |

(52) U.S. Cl.
CPC .... *H01L 23/5226* (2013.01); *H01L 21/76885* (2013.01); *H01L 23/53228* (2013.01); *H01L 23/53257* (2013.01)

(58) Field of Classification Search
CPC .................................................. H01L 23/5226
See application file for complete search history.

(56) References Cited

U.S. PATENT DOCUMENTS

| | | | |
|---|---|---|---|
| 10,096,544 B2 | 10/2018 | Lai et al. | |
| 10,217,705 B1 | 2/2019 | Qian et al. | |
| 2002/0086519 A1 | 7/2002 | Houston et al. | |
| 2002/0125577 A1* | 9/2002 | Komada ............... | H01L 23/564 |
| | | | 257/E21.582 |
| 2015/0145055 A1* | 5/2015 | Kim .................... | H01L 23/5226 |
| | | | 438/618 |
| 2021/0143061 A1 | 5/2021 | Amanapu et al. | |
| 2021/0407907 A1 | 12/2021 | Yoo et al. | |
| 2022/0028785 A1 | 1/2022 | Anderson et al. | |
| 2022/0093505 A1 | 3/2022 | Jezewski et al. | |
| 2022/0359376 A1* | 11/2022 | Pan ................... | H01L 21/76831 |

* cited by examiner

*Primary Examiner* — Yu-Hsi D Sun

(74) *Attorney, Agent, or Firm* — Myers Bigel, P.A.

(57) ABSTRACT

Integrated circuit devices are provided. An integrated circuit device includes an insulating layer and a metal via structure that is in the insulating layer. The metal via structure has a lower portion and an upper portion that is narrower than the lower portion. Moreover, the integrated circuit device includes a metal line that is on and electrically connected to the metal via structure. Related methods of forming integrated circuit devices are also provided.

20 Claims, 7 Drawing Sheets

100

130 — BEOL REGION

120 — FEOL/MEOL REGION

110 — SUBSTRATE

Z
Y X

FEOL/MEOL PROCESSES ⟋—410

FORM OPENINGS IN INSULATING LAYER ⟋—415

FORM METAL IN OPENINGS ⟋—420

FORM METAL LAYER ⟋—425

FORM 1ST MASK ⟋—430

FORM 2ND MASK IN OPENINGS OF 1ST MASK ⟋—435

REMOVE 1ST MASK ⟋—440

ETCH METAL LAYER ⟋—445

REMOVE 2ND MASK ⟋—450

FORM INSULATING MATERIAL ⟋—455

FORM METAL LINES ⟋—460

INTEGRATED CIRCUIT DEVICES INCLUDING VIA STRUCTURES HAVING A NARROW UPPER PORTION, AND RELATED FABRICATION METHODS

CLAIM OF PRIORITY

The present application claims the benefit of U.S. Provisional Patent Application Ser. No. 63/335,887, filed on Apr. 28, 2022, entitled STACKED VIA SCHEMES AND METHODS OF FORMING THE SAME, the disclosure of which is hereby incorporated herein in its entirety by reference.

FIELD

The present disclosure generally relates to the field of integrated circuit devices and, more particularly, to via structures in integrated circuit devices.

BACKGROUND

As integrated circuit devices continue to increase in density and performance, it may be difficult to scale via structures and metal lines of integrated circuit devices. For example, scaled-down via structures and metal lines may be undesirably close to each other and/or may be more susceptible to misalignment. As an example, a scaled-down via structure and a scaled-down metal line may inadvertently contact each other.

SUMMARY

An integrated circuit device, according to some embodiments herein, may include an insulating layer. The integrated circuit device may include a metal via structure that is in the insulating layer and has a lower portion and an upper portion that is narrower than the lower portion. Moreover, the integrated circuit device may include a metal line that is on and electrically connected to the metal via structure. The upper portion of the metal via structure may be between the metal line and the lower portion of the metal via structure.

An integrated circuit device, according to some embodiments herein, may include a first insulating layer. The integrated circuit device may include first and second metal via structures that are spaced apart from each other in the first insulating layer and that each have a lower portion and an upper portion that is narrower than the lower portion. The integrated circuit device may include a second insulating layer on the first insulating layer. The integrated circuit device may include first and second metal lines that are in the second insulating layer and electrically connected to the first and second metal via structures, respectively. The integrated circuit device may include a third metal line that is in the second insulating layer and between the first and second metal lines. The integrated circuit device may include a third insulating layer on the second insulating layer. Moreover, the integrated circuit device may include a fourth metal line in the third insulating layer and electrically connected to the third metal line.

A method of forming an integrated circuit device, according to some embodiments herein, may include forming a metal layer on a plurality of metal protrusions that are spaced apart from each other and protrude upward from a metal base, and on an insulating layer that is on sidewalls of the metal protrusions. The method may include exposing an upper surface of the insulating layer and portions of upper surfaces of the metal protrusions by etching the metal layer. The metal protrusions may be lower portions, respectively, of metal via structures that are in the insulating layer. Portions of the metal layer that remain on the metal protrusions after the etching may be upper portions, respectively, of the metal via structures. Moreover, the upper portions of the metal via structures may be narrower than the lower portions of the metal via structures.

DETAILED DESCRIPTION

Pursuant to embodiments herein, integrated circuit devices are provided that include metal via structures having narrow upper portions. For example, embodiments herein can provide a metal via structure having a lower portion and an upper portion, where the upper portion is narrower than the lower portion. The narrow upper portion can increase a distance between the metal via structure and a metal line that is adjacent (e.g., diagonally above) the metal via structure, and thus may be beneficial for manufacturing high-density integrated circuit devices. The metal via structure may be part of a BEOL region of an integrated circuit device.

Moreover, the metal via structure having the lower and upper portions may be easier to form (e.g., may have an increased process/gap-fill margin) than a via structure that has only a single metal region. As an example, embodiments herein may provide improved gap-fill ability (e.g., when providing metal in an opening of an insulating layer to form the lower portion) and easier metal etching (e.g., to form the upper portion) by manufacturing the metal via structure that has the lower and upper portions.

Example embodiments will be described in greater detail with reference to the attached figures.

Figure 1:
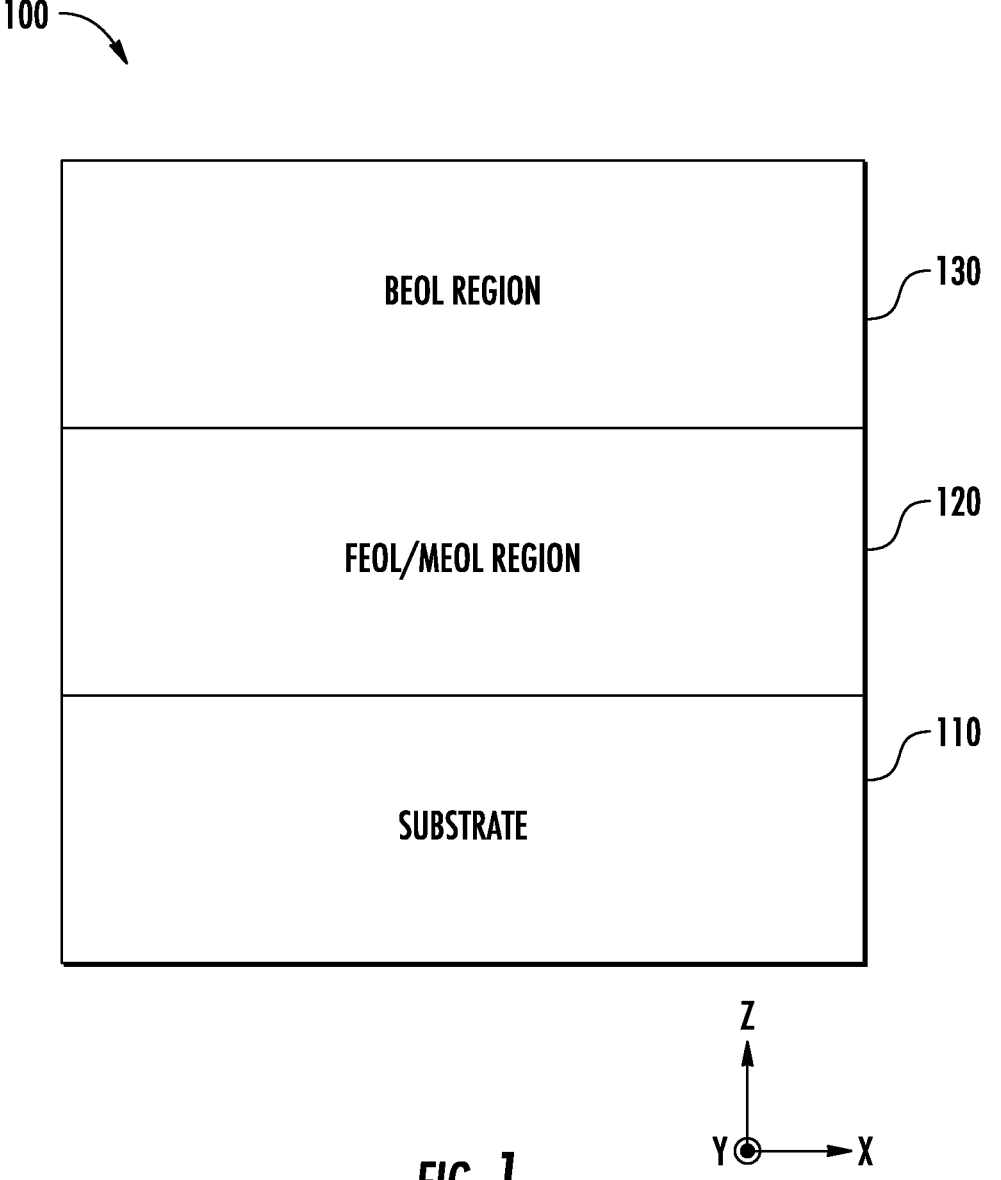
FIG. 1 is a schematic block diagram of an integrated circuit device according to some embodiments herein.

FIG. 1 is a schematic block diagram of an integrated circuit device 100 according to some embodiments. The device 100 may be, for example, a semiconductor memory device for storing data and/or a semiconductor logic device for processing data. The device 100 includes a substrate 110, a BEOL region 130 that is on the substrate 110, and a front-end-of-line ("FEOL") and/or middle-end-of-line ("MEOL") region 120 that is between (in a vertical direction Z) the BEOL region 130 and the substrate 110. As an example, the FEOL/MEOL region 120 may include devices such as transistors, capacitors, and/or resistors. Moreover, the BEOL region 130 may include interconnect wires, vias, and dielectric structures.

Figure 2A:
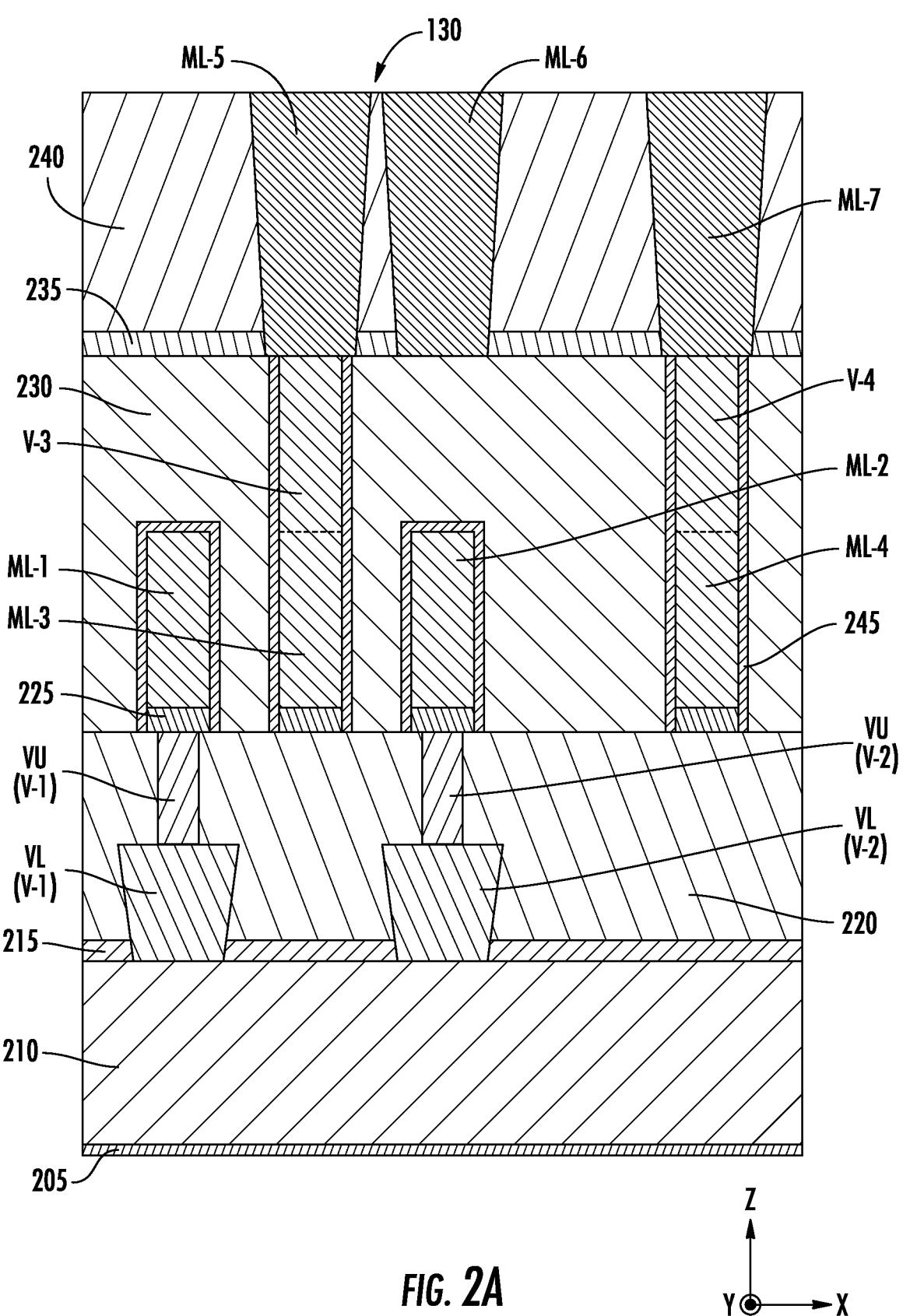
FIG. 2A is a cross-sectional view of the back-end-of-line ("BEOL") region of the integrated circuit device of FIG. 1.

FIG. 2A is a cross-sectional view of the BEOL region 130 of the example integrated circuit device 100 of FIG. 1. The BEOL region 130 comprises a plurality of BEOL elements, including seven metal lines (e.g., metal wires) ML-1 through ML-7, four metal via structures V-1 through V-4, and three insulating layers 220, 230, 240.

The first and second via structures V-1 and V-2 each include a respective lower portion VL that protrudes upward from a metal base 210 in the vertical direction Z away from the substrate 110 (FIG. 1) of the device 100. In some embodiments, the lower portions VL include the same metal as the base 210. For example, the base 210 and the lower portions VL may each include tungsten or copper.

The first and second via structures V-1 and V-2 each include a respective upper portion VU that is on top of the respective lower portion VL. The lower portions VL are thus between, in the direction Z, the upper portions VU, respectively, and the base 210. According to some embodiments, the upper portions VU may include a different metal from the lower portions VL. As an example, the upper portions VU may include ruthenium or molybdenum.

The first via structure V-1 is spaced apart from the second via structure V-2 in the insulating layer 220. For example, the upper portion VU of the first via structure V-1 may be separated from the upper portion VU of the second via structure V-2 in a horizontal direction X by the insulating layer 220, and the lower portion VL of the first via structure V-1 may be separated from the lower portion VL of the second via structure V-2 in the direction X by the insulating layer 220.

As shown in FIG. 2A, the insulating layer 220 may be on an upper surface of the base 210, sidewalls of the upper portions VU, and sidewalls of the lower portions VL. Accordingly, the upper portions VU and lower portions VL may be in the insulating layer 220. As an example, the insulating layer 220 may contact the sidewalls of the upper portions VU and the sidewalls of the lower portions VL. In some embodiments, an upper surface of the insulating layer 220 may be coplanar with upper surfaces of the upper portions VU. The insulating layer 220 may comprise, for example, silicon oxide, silicon oxynitride, silicon nitride, or a low-k dielectric material.

As used herein, the term "low-k" refers to a material that has a smaller dielectric constant than silicon dioxide. The low-k material may include, for example, fluorine-doped silicon dioxide, organosilicate glass, carbon-doped oxide, porous silicon dioxide, porous organosilicate glass, a spin-on organic polymeric dielectric, or a spin-on silicon based polymeric dielectric.

According to some embodiments, an etch stop layer 215 may be between a lower surface of the insulating layer 220 and the upper surface of the base 210. Moreover, an etch stop layer 205 may be on (e.g., may contact) a lower surface of the base 210. The etch stop layers 205, 215 may comprise, for example, silicon and nitrogen. In other embodiments, the etch stop layer 205 and/or the etch stop layer 215 may be omitted. Accordingly, the lower surface of the insulating layer 220 may contact the upper surface of the base 210.

The insulating layer 230 is on (e.g., may contact) the upper surface of the insulating layer 220. The four metal lines ML-1 through ML-4 are in the insulating layer 230. In some embodiments, the four metal lines ML-1 through ML-4 may comprise the same metal (e.g., ruthenium or molybdenum) as the upper portions VU of the first and second via structures V-1, V-2. Moreover, the first and second metal lines ML-1, ML-2 may be on and electrically connected to the first and second via structures V-1, V-2, respectively.

For example, the first metal line ML-1 may overlap and be adjacent the upper portion VU of the first via structure V-1 in the direction Z, and the second metal line ML-2 may overlap and be adjacent the upper portion VU of the second via structure V-2 in the direction Z. The upper portion VU of the first via structure V-1 is between, in the direction Z, the first metal line ML-1 (e.g., a lower surface thereof) and the lower portion VL of the first via structure V-1. Likewise, the upper portion VU of the second via structure V-2 is between, in the direction Z, the second metal line ML-2 (e.g., a lower surface thereof) and the lower portion VL of the second via structure V-2.

According to some embodiments, an insulating material of the insulating layer 230 may be different from that of the insulating layer 220. For example, the insulating layer 230 may comprise nitrogen, and the insulating layer 220 may not comprise nitrogen (e.g., may comprise oxygen but not nitrogen), or vice versa.

In some embodiments, first and second conductive adhesion layers 225 may be (and may increase adhesion) between the first and second metal lines ML-1, ML-2, respectively, and the first and second via structures V-1, V-2. The conductive adhesion layers 225 may be in the insulating layer 230 and may comprise, for example, tantalum nitride or titanium nitride. In other embodiments, the conductive adhesion layers 225 may be omitted. As an example, the first and second metal lines ML-1, ML-2 may contact respective upper portions VU of the first and second via structures V-1, V-2.

The third metal line ML-3 may be between, in the direction X, the first and second metal lines ML-1, ML-2. Moreover, the second metal line ML-2 may be between the third metal line ML-3 and the fourth metal line ML-4. The third and fourth metal lines ML-3, ML-4 may be electrically isolated from the first and second via structures V-1, V-2. In the cross-sectional view shown in FIG. 2A, the third and fourth metal lines ML-3, ML-4 may not overlap, in the direction Z, any via structure V that is in the insulating layer 220. The seven metal lines ML-1 through ML-7, however, may each extend longitudinally in a horizontal direction Y, and may each be electrically connected to one or more via structures V and/or metal lines ML that are not shown in the cross-sectional view of FIG. 2A. According to some embodiments, the seven metal lines ML-1 through ML-7 may each extend longer in the direction Y than each of the four via structures V-1 through V-4.

The third and fourth via structures V-3, V-4 may be in the insulating layer 230 and on and electrically connected to the third and fourth metal lines ML-3, ML-4, respectively. For example, the third and fourth via structures V-3, V-4 may overlap and contact the third and fourth metal lines ML-3, ML-4, respectively, in the direction Z. In some embodiments, the third and fourth via structures V-3, V-4 may comprise the same metal (e.g., ruthenium or molybdenum) as the third and fourth metal lines ML-3, ML-4. Accordingly, visible boundaries between the third and fourth via structures V-3, V-4 and the third and fourth metal lines ML-3, ML-4, respectively, may not be present. For simplicity of illustration, however, boundaries between the third and fourth via structures V-3, V-4 and the third and fourth metal lines ML-3, ML-4, respectively, are shown in FIG. 2A with dotted lines.

Each of the four metal lines ML-1 through ML-4 may be separated from the insulating layer 230 by an insulating adhesion layer 245, which may be configured to increase adhesion between the four metal lines ML-1 through ML-4 and the insulating layer 230. The insulating adhesion layer 245 may comprise, for example, silicon nitride or silicon carbonitride, and may be formed by a deposition process such as chemical vapor deposition ("CVD") or atomic layer deposition ("ALD"). In some embodiments, the third and fourth via structures V-3, V-4 may each be separated from the insulating layer 230 by an insulating adhesion layer 245. Moreover, respective upper surfaces of the third and fourth via structures V-3, V-4 may be coplanar with an upper surface of the insulating layer 230.

The fifth, sixth, and seventh metal lines ML-5 through ML-7 are in the insulating layer 240, which is on the insulating layer 230. The fifth and seventh metal lines ML-5, ML-7 are on and electrically connected to (e.g., in contact with) the third and fourth via structures V-3, V-4, respectively. The sixth metal line ML-6 may be between, in the direction X, the fifth and seventh metal lines ML-5, ML-7. In some embodiments, the insulating layer 240 may comprise a different insulating material from that of the insulating layer 230 and/or the same insulating material as that of the insulating layer 220. Moreover, the fifth through seventh metal lines ML-5 through ML-7 may comprise the same metal (e.g., ruthenium or molybdenum) as the third and fourth via structures V-3, V-4.

According to some embodiments, an insulating layer 235 may be between, in the direction Z, the insulating layers 230, 240. In some embodiments, the insulating layer 235 may be implemented as an etch stop layer, which may comprise, for example, silicon and nitrogen. The insulating layers 230, 235, 240 may, according to some embodiments, include three different insulating materials, respectively. Moreover, the fifth through seventh metal lines ML-5 through ML-7 may be in the insulating layer 235.

Figure 2B:
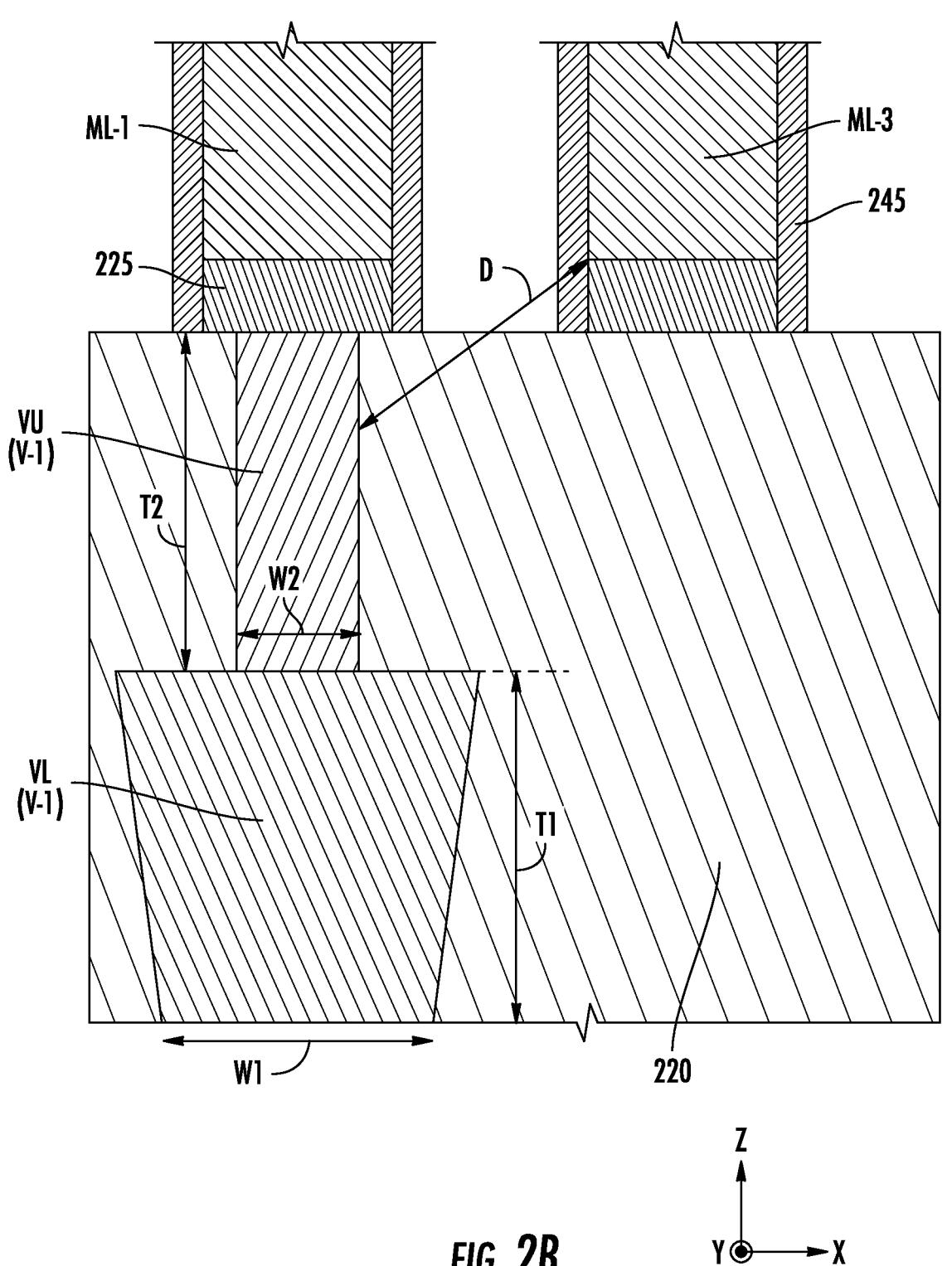
FIG. 2B is an enlarged view of the first metal via structure of FIG. 2A.

FIG. 2B is an enlarged view of the first metal via structure V-1 of FIG. 2A. As shown in FIG. 2B, the lower and upper portions VL, VU of the via structure V-1 have different first and second widths W1, W2, respectively, in the direction X. The second width W2 is narrower than the first width W1. Accordingly, an upper surface of the lower portion VL may comprise a first portion that contacts (and/or is overlapped in the direction Z by) the insulating layer 220 and a second portion that contacts a lower surface of the upper portion VU. For example, the second width W2 may be about half of the first width W1, or even narrower than half of the first width W1.

Because the upper portion VU is narrower than the lower portion VL, a distance D (e.g., a diagonal distance) between the via structure V-1 and the third metal line ML-3 may be longer than if the second width W2 were equal to or wider than the first width W1. Accordingly, a larger amount of the insulating layer 220 may separate the via structure V-1 and the third metal line ML-3 from each other. The narrow second width W2 may thus be beneficial for high-density integrated circuit devices.

The lower and upper portions VL, VU have first and second thicknesses T1, T2, respectively, in the direction Z. The first and second thicknesses T1, T2 may each be shorter than the vertical thickness of a typical via structure that has only a single metal region (e.g., only a ruthenium or molybdenum region and no tungsten or copper region) rather than the lower and upper portions VL, VU. As a result, the via structure V-1 having the lower and upper portions VL, VU may be easier to form (e.g., may have an improved reactive ion etching ("RIE") process margin) than a via structure that has only a single metal region. For example, the lower portion VL may be formed by filling an opening in the insulating layer 220 with a first metal (e.g., tungsten or copper), and the opening may be easier to fill when the first thickness T1 is small and the first width W1 is wide. Moreover, the upper portion VU may be formed by etching a metal layer (e.g., a layer comprising a second metal such as ruthenium or molybdenum), and the metal layer may be easier to etch when the second thickness T2 is small (e.g., when it is thinner than a via structure that has only a single metal region).

In some embodiments, the first thickness T1 may equal the second thickness T2. The lower and upper portions VL, VU may thus each comprise half of the total vertical thickness of the via structure V-1. According to some embodiments, the first thickness T1 and the second thickness T2 may each be smaller than a thickness, in the direction Z, of the first metal line ML-1. Moreover, the upper portion VU may, in some embodiments, have a uniform width, such that an upper surface and a lower surface of the upper portion VU each have the second width W2. The lower portion VL, on the other hand, may be tapered away from the upper portion VU, such that a lower surface of the lower portion VL has the first width W1 and an upper surface of the lower portion VL is wider, in the direction X, than the first width W1. The first width W1 may thus be the smallest width of the lower portion VL.

FIG. 2B also shows that the second width W2 of the upper portion VU may be narrower, in the direction X, than the first metal line ML-1 thereon. Moreover, the second via structure V-2 (FIG. 2A) may, in some embodiments, have a structure similar to that of the first via structure V-1 that is shown in FIG. 2B. For example, the upper portion VU of the second via structure V-2 may be narrower, in the direction X, than the lower portion VL of the second via structure V-2. As another example, the second metal line ML-2 (FIG. 2A) may be on, electrically connected to, and wider (in the direction X) than the upper portion VU of the second via structure V-2.

FIGS. 3A-3G are cross-sectional views illustrating operations of forming an integrated circuit device 100 (FIG. 1) according to some embodiments. FIG. 4 is a flowchart corresponding to the operations shown in FIGS. 3A-3G.

Figure 3A:
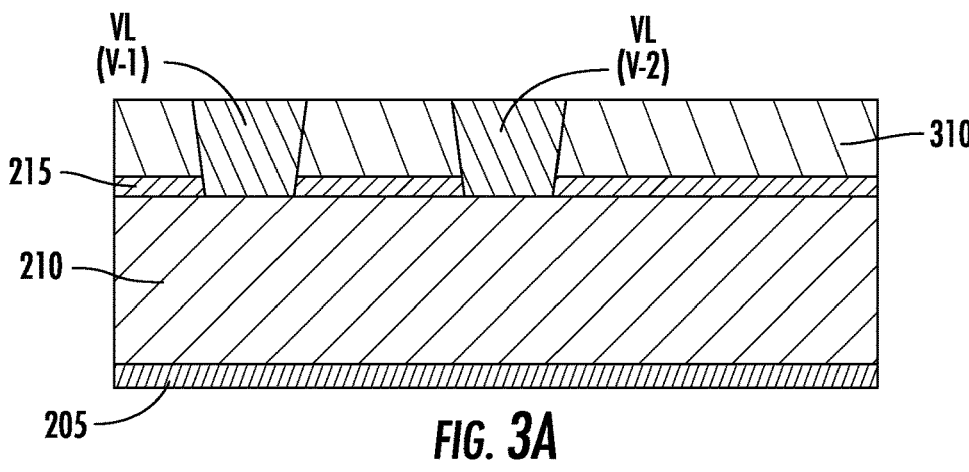
FIGS. 3A-3G are cross-sectional views illustrating operations of forming an integrated circuit device according to some embodiments herein.
Figure 4:
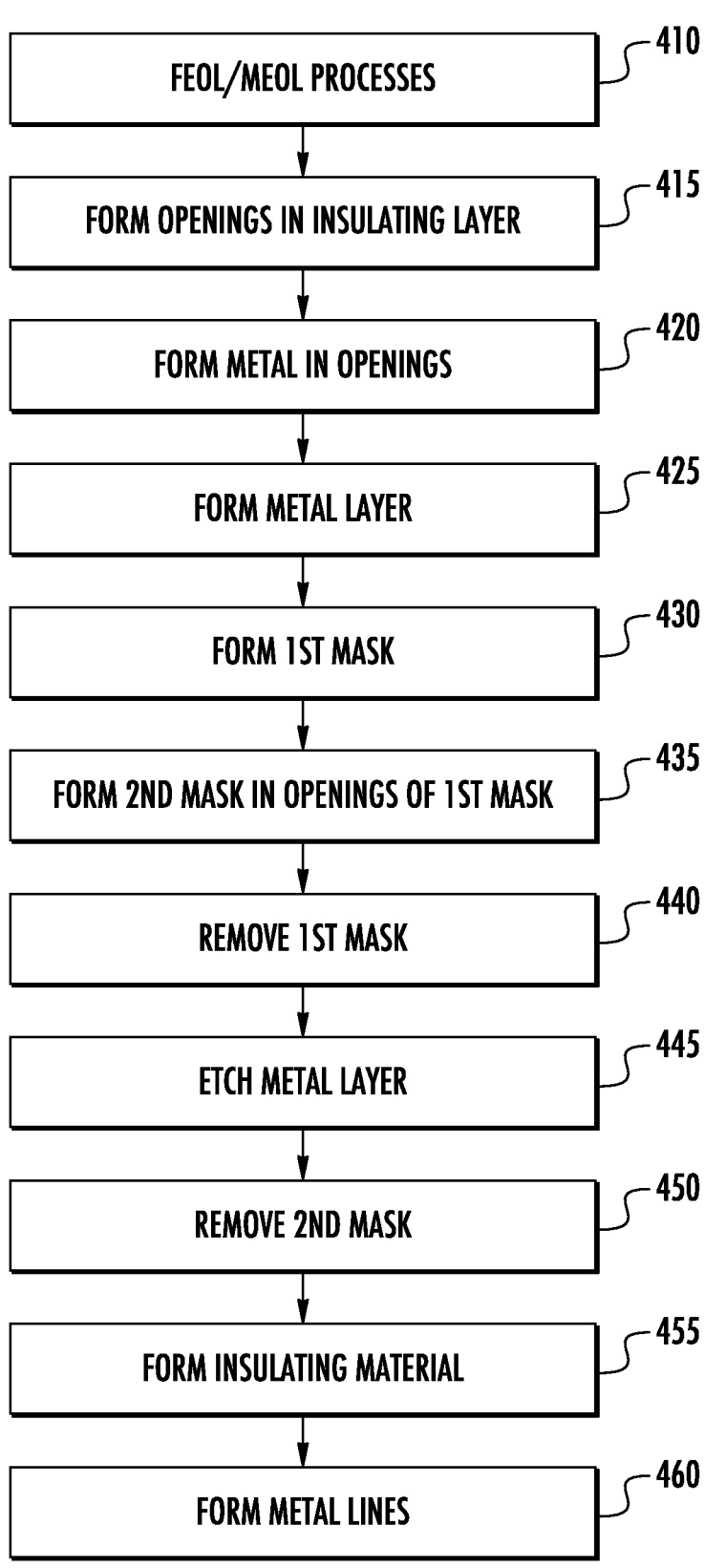
FIG. 4 is a flowchart corresponding to the operations shown in FIGS. 3A-3G.

As shown in FIGS. 3A and 4, the operations may include forming (Block 415) openings in an insulating layer 310 and forming (Block 420) metal in the openings. For example, a damascene process may be used to provide the metal through the openings and into a space that is below a lower surface of the insulating layer 310, thereby forming the metal base 210, and to fill the openings with the metal, thereby forming the lower portions VL of the first and second via structures V-1, V-2 in the insulating layer 310. As an example, the cross-sectional view that is shown in FIG. 3A includes two openings that are filled with the two lower portions VL, respectively. The lower portions VL may be metal protrusions, respectively, that are spaced apart from each other in the direction X (FIG. 2A) and protrude upward from the metal base 210 in the direction Z (FIG. 2A). The insulating layer 310 is on sidewalls of the lower portions VL.

The metal of the lower portions VL and the metal base 210 may comprise, for example, tungsten or copper. Moreover, the etch stop layer 205 and/or the etch stop layer 215 may, in some embodiments, be formed before forming the openings (and thus before forming the metal therein).

According to some embodiments, the openings may be formed after performing (Block 410) FEOL/MEOL processes on the substrate 110 (FIG. 1). For example, all elements of the FEOL/MEOL region 120 (FIG. 1) of the integrated circuit device 100 may be formed before forming the openings. All operations shown in FIG. 4 after Block 410 may thus be BEOL operations/processes.

Figure 3B:
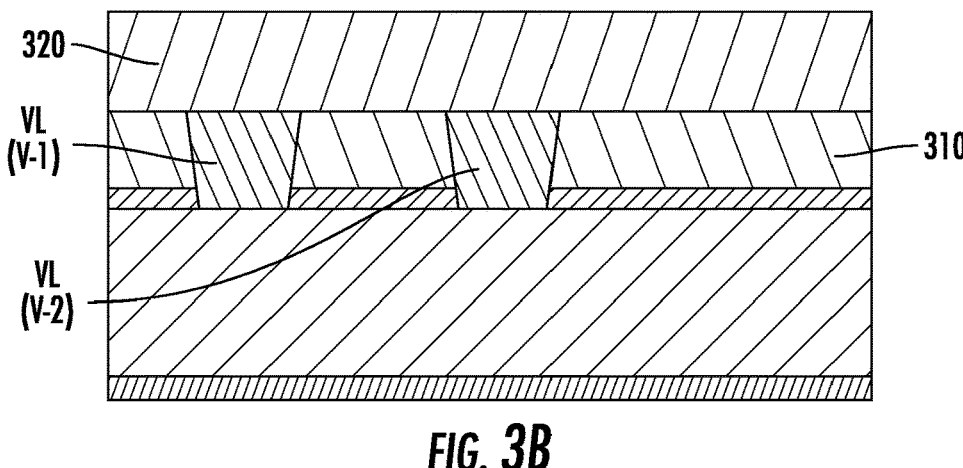

As shown in FIGS. 3B and 4, the BEOL operations may include forming (Block 425) a metal layer 320 on the lower portions VL (e.g., on exposed upper surfaces, respectively, thereof). In some embodiments, the metal layer 320 may comprise a metal different from that of the lower portions VL. For example, the metal layer 320 may comprise ruthenium or molybdenum, and the lower portions VL may comprise tungsten or copper. The metal layer 320 is an etchable metal layer that will subsequently be etched.

Figure 3C:
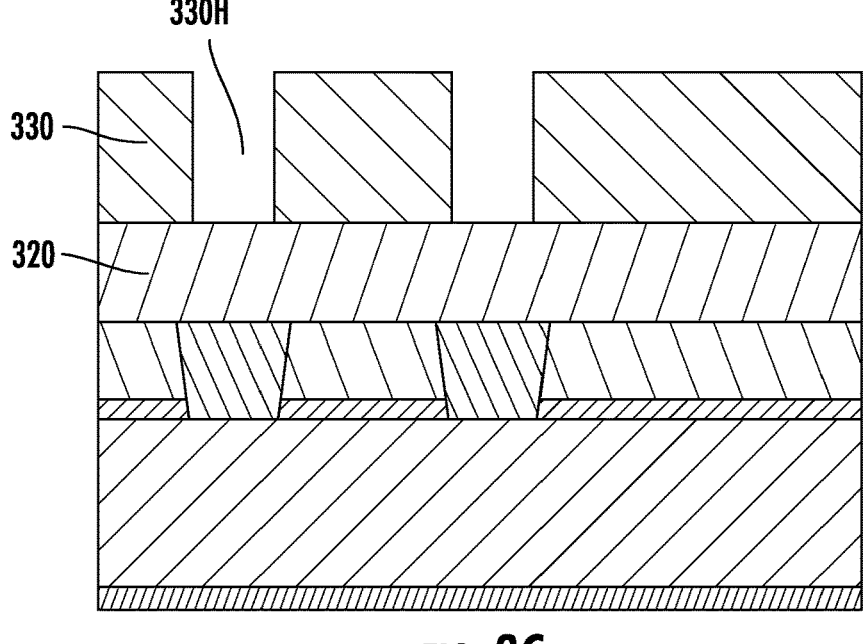

As shown in FIGS. 3C and 4, the BEOL operations may include forming (Block 430) a first mask 330 that covers first portions of the metal layer 320 that will be etched. Moreover, the first mask 330 has openings 330H therein that expose second portions of the metal layer 320 that will remain after etching the metal layer 320. According to some embodiments, the first mask 330 may comprise a photoresist material and may be processed with photolithography to form the openings 330H. The openings 330H may overlap the lower portions VL (FIG. 3B) of the first and second via structures V-1, V-2 (FIG. 3B), respectively, in the direction Z (FIG. 2A), and may each be narrower, in the direction X (FIG. 2A) than each of the lower portions VL.

Figure 3D:
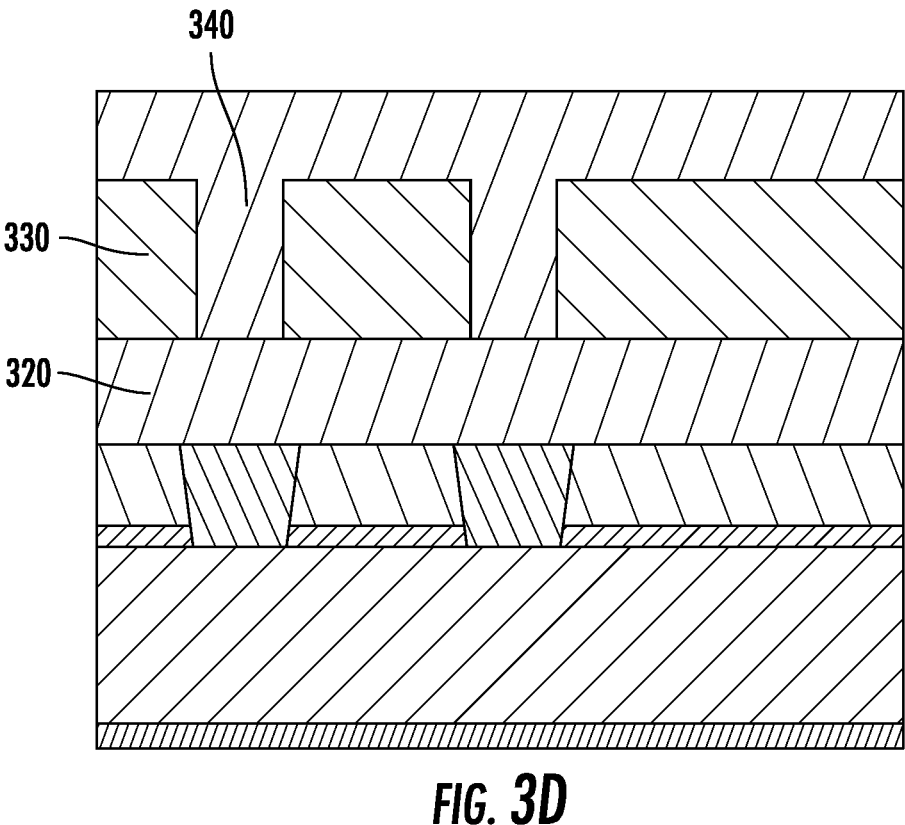
Figure 3E:
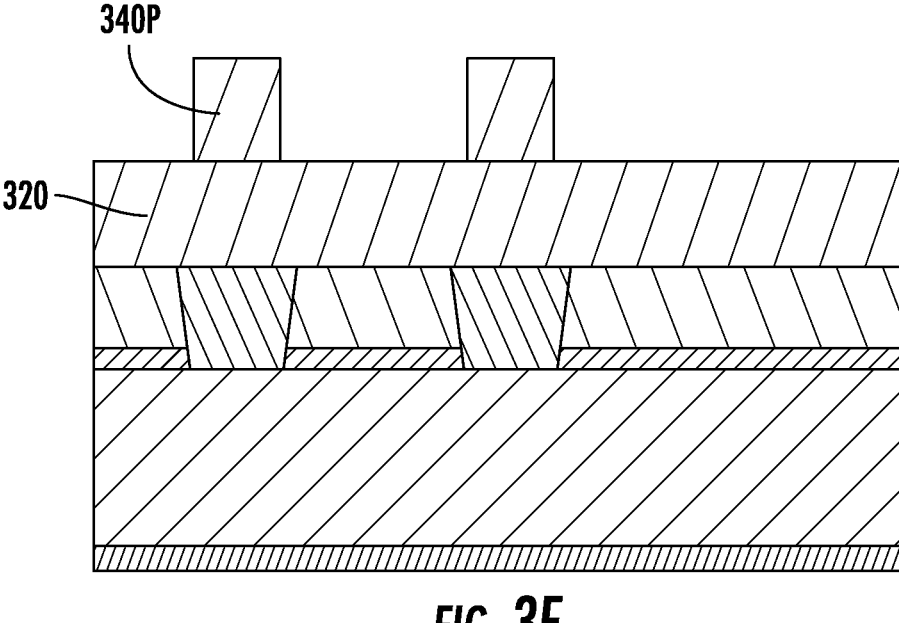

As shown in FIGS. 3D, 3E, and 4, the BEOL operations may include forming (Block 435) a second mask 340P in the openings 330H (FIG. 3C) of the first mask 330. For example, the second mask 340P may be formed by using a gap-fill technique to form a gap-fill layer 340 that is shown in FIG. 3D, etching/planarizing (e.g., by chemical-mechanical planarization ("CMP")) the gap-fill layer 340, and then removing (Block 440) the first mask 330, as shown in FIG. 3E.

Figure 3F:
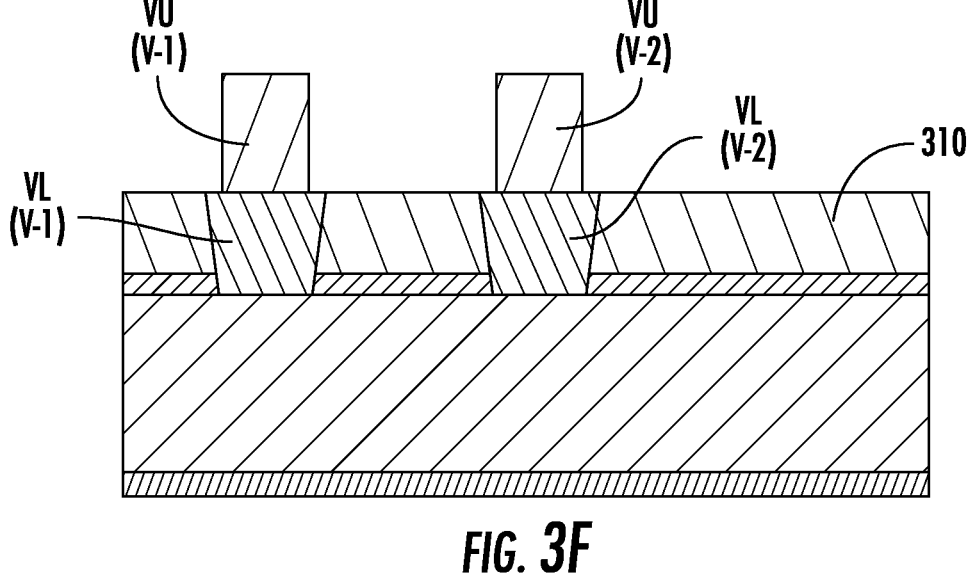

As shown in FIGS. 3F and 4, the BEOL operations may include etching (Block 445) the metal layer 320 (FIG. 3E) while using the second mask 340P as an etch mask. As a result, the upper portions VU of the first and second via structures V-1, V-2 may be formed and may be narrower than the lower portions VL. The upper portions VU are thus the portions of the metal layer 320 that remain on the lower portions VL after etching the metal layer 320. FIG. 3F shows that portions of upper surfaces of the lower portions VL are exposed after etching the metal layer 320, and that an upper surface of the insulating layer 310 is exposed after etching the metal layer 320. Moreover, the second mask 340P may be removed (Block 450) after etching the metal layer 320.

Figure 3G:
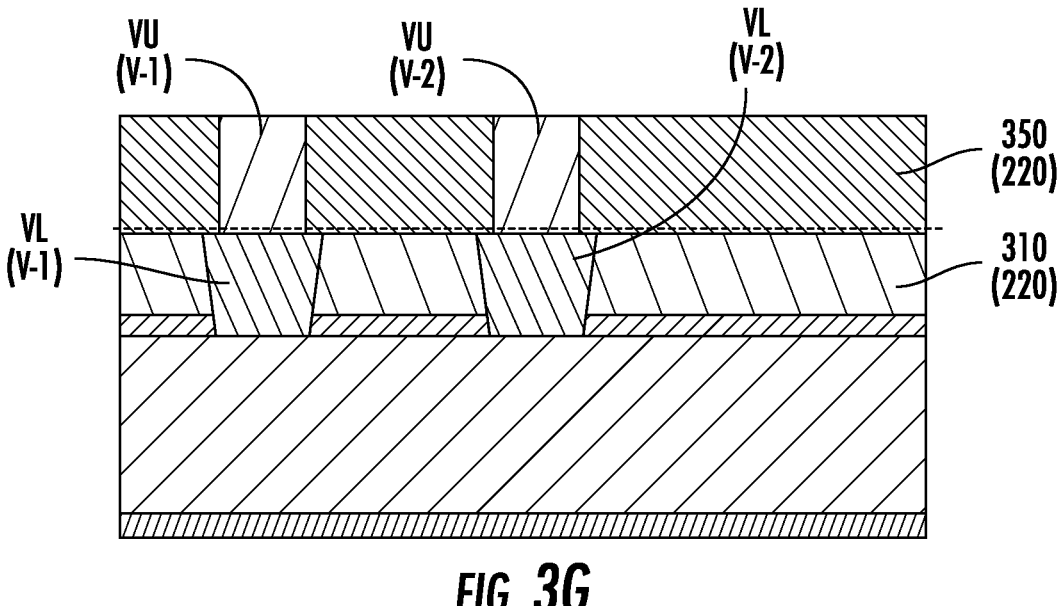

As shown in FIGS. 3G and 4, the BEOL operations may include forming (Block 455) an insulating material 350 on an upper surface of the insulating layer 310 and on sidewalls of the upper portions VU. For example, the insulating material 350 may be a low-k dielectric material.

In some embodiments, the insulating material 350 and the insulating layer 310 may comprise the same insulating material. Accordingly, a visible boundary between the insulating material 350 and the insulating layer 310 may not be present. For simplicity of illustration, however, a boundary between the insulating material 350 and the insulating layer 310 is shown in FIG. 3G with a dotted line. The insulating material 350 and the insulating layer 310 may collectively provide the insulating layer 220 that is shown in FIG. 2A.

As shown in FIGS. 2A and 4, the BEOL operations may also include forming (Block 460) a plurality of metal lines ML on the insulating layer 220. For example, FIG. 2A shows that the first and second metal lines ML-1, ML-2 may be formed on the upper portions VU, respectively, of the first and second via structures V-1, V-2, and on the upper surface of the insulating layer 220 (as the metal lines ML may be wider than the upper portions VU).

The third and fourth metal lines ML-3, ML-4, which may not overlap the upper portions VU in the direction Z, may also be formed on the insulating layer 220. As illustrated in FIG. 2A, the third metal line ML-3 may be between, in the direction X, the first and second metal lines ML-1, ML-2.

The second metal line ML-2 may be between, in the direction X, the fourth metal line ML-4 and the third metal line ML-3. Moreover, the third and fourth via structures V-3, V-4 may be formed on the third and fourth metal lines ML-3, ML-4, respectively.

The insulating layer 230 may be formed on sidewalls of the first through fourth metal lines ML-1 through ML-4 (and on sidewalls of the third and fourth via structures V-3, V-4). Moreover, the fifth, sixth, and seventh metal lines ML-5 through ML-7 may be formed on the insulating layer 230, and the insulating layer 240 may be formed on sidewalls of the fifth, sixth, and seventh metal lines ML-5 through ML-7.

Integrated circuit devices 100 (FIG. 1) according to embodiments herein may provide a number of advantages. These advantages include reduced susceptibility to misalignment of metal via structures V (FIG. 2A) and metal lines ML (FIG. 2A). For example, a first metal via structure V-1 (FIG. 2B) may have a lower portion VL (FIG. 2B) and an upper portion VU (FIG. 2B), where the upper portion VU is narrower than the lower portion VL. The narrow upper portion VU can increase a distance D (FIG. 2B) between the first via structure V-1 and the third metal line ML-3 (FIG. 2B) that is diagonally adjacent the first via structure V-1, and thus may be beneficial for manufacturing high-density integrated circuit devices (as the increased distance D may allow the first via structure V-1 and the third metal line ML-3 to be scaled down without being so close as to allow for shorting).

Moreover, the first via structure V-1 having the lower and upper portions VL, VU may be easier to manufacture than a via structure that has only a single metal region. As an example, embodiments herein may provide improved gap-fill ability (e.g., when providing metal in an opening of the insulating layer 310 (FIG. 3A) to form the lower portion VL), and easier metal etching (e.g., due to the thinness of the metal layer 320 (FIG. 3E) from which the upper portion VU is formed), by manufacturing the first via structure V-1 that has the lower and upper portions VL, VU rather than a via structure that has only a single metal region.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present invention.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:

1. An integrated circuit device comprising:
a substrate;
an insulating layer on the substrate, wherein the insulating layer is a monolithic structure;
a metal via structure that comprises a lower portion in the insulating layer and an upper portion in the insulating layer; and
a metal line that is on and electrically connected to the metal via structure,
wherein the upper portion of the metal via structure is between the metal line and the lower portion of the metal via structure,
wherein the lower portion of the metal via structure is between the upper portion of the metal via structure and the substrate,
wherein a first width of a lower surface of the upper portion of the metal via structure in a horizontal direction is less than a second width of an upper surface of the lower portion of the metal via structure in the horizontal direction, and
wherein the horizontal direction is parallel with an upper surface of the substrate.

2. The integrated circuit device of claim 1, wherein the upper portion of the metal via structure has a uniform width in the horizontal direction, and wherein the lower portion of the metal via structure has a first vertical thickness that is equal to a second vertical thickness of the upper portion of the metal via structure.

3. The integrated circuit device of claim 1, wherein the lower portion of the metal via structure is tapered away from the upper portion of the metal via structure.

4. The integrated circuit device of claim 1, wherein the upper surface of the lower portion of the metal via structure comprises a first portion that contacts the insulating layer and a second portion that contacts the lower surface of the upper portion of the metal via structure.

5. The integrated circuit device of claim 1, wherein the lower portion of the metal via structure protrudes upward from a metal base toward the upper portion of the metal via structure.

6. The integrated circuit device of claim 5,
wherein the metal via structure comprises a first metal via structure and the metal line comprises a first metal line,
wherein the integrated circuit device further comprises:
a second metal via structure that comprises a lower portion in the insulating layer and an upper portion in the insulating layer; and
a second metal line that is on and electrically connected to the second metal via structure,
wherein the upper portion of the second metal via structure is between the second metal line and the lower portion of the second metal via structure, wherein the lower portion of the second metal via structure is between the upper portion of the second metal via structure and the substrate, wherein a third width of a lower surface of the upper portion of the second metal via structure in the horizontal direction is less than a fourth width of an upper surface of the lower portion of the second metal via structure in the horizontal direction.

7. The integrated circuit device of claim 6, wherein the insulating layer comprises a first insulating layer, and wherein the integrated circuit device further comprises:

a second insulating layer that is on a sidewall of the first metal line and a sidewall of the second metal line; and a third metal line that is in the second insulating layer and between the first and second metal lines.

8. The integrated circuit device of claim 7, further comprising:

a third metal via structure that is in the second insulating layer and is on and electrically connected to the third metal line;

a third insulating layer on the second insulating layer; and a fourth metal line that is on and electrically connected to the third metal via structure.

9. The integrated circuit device of claim 1, wherein the insulating layer is on a sidewall of the lower portion of the metal via structure and a sidewall of the upper portion of the metal via structure.

10. The integrated circuit device of claim 1, wherein a third width of an upper surface of the upper portion of the metal via structure in the horizontal direction is less than a fourth width of a lower surface of the metal line in the horizontal direction.

11. An integrated circuit device comprising:

a substrate;

a first insulating layer on the substrate, wherein the first insulating layer is a monolithic structure;

first and second metal via structures that are spaced apart from each other in the first insulating layer and that each comprise a lower portion and an upper portion in the first insulating layer, wherein the lower portion is between the upper portion and the substrate;

a second insulating layer on the first insulating layer;

first and second metal lines that are in the second insulating layer and electrically connected to the first and second metal via structures, respectively;

a third metal line that is in the second insulating layer and between the first and second metal lines;

a third insulating layer on the second insulating layer; and a fourth metal line in the third insulating layer and electrically connected to the third metal line, wherein a first width of a lower surface of the upper portion of the first metal via structure in a horizontal direction is less than a second width of an upper surface of the lower portion of the first metal via structure in the horizontal direction, wherein a third width of a lower surface of the upper portion of the second metal via structure in the horizontal direction is less than a fourth width of an upper surface of the lower portion of the second metal via structure in the horizontal direction, and wherein the horizontal direction is parallel with an upper surface of the substrate.

12. The integrated circuit device of claim 11, wherein the lower portions of the first and second metal via structures protrude upward from a metal base toward the second insulating layer.

13. The integrated circuit device of claim 12, wherein the metal base and the lower portions of the first and second metal via structures comprise a first metal, and wherein the upper portions of the first and second metal via structures comprise a second metal that is different from the first metal.

14. An integrated circuit device comprising:

a substrate;

an insulating layer on the substrate;

a metal via structure that comprises a lower portion in the insulating layer and an upper portion in the insulating layer; and a metal line that is on and electrically connected to the metal via structure, wherein the upper portion of the metal via structure is between the metal line and the lower portion of the metal via structure, wherein the lower portion of the metal via structure is between the upper portion of the metal via structure and the substrate, wherein a first width of a lower surface of the upper portion of the metal via structure in a horizontal direction is less than a second width of an upper surface of the lower portion of the metal via structure in the horizontal direction, wherein the lower and upper portions of the metal via structure comprise different first and second metals, respectively, and wherein the horizontal direction is parallel with an upper surface of the substrate.

15. The integrated circuit device of claim 14, wherein the first metal comprises tungsten or copper, and wherein the second metal comprises ruthenium or molybdenum.

16. The integrated circuit device of claim 14, wherein the upper portion of the metal via structure has a uniform width in the horizontal direction, and wherein the lower portion of the metal via structure has a first vertical thickness that is equal to a second vertical thickness of the upper portion of the metal via structure.

17. The integrated circuit device of claim 14, wherein the lower portion of the metal via structure is tapered away from the upper portion of the metal via structure.

18. The integrated circuit device of claim 14, wherein the upper surface of the lower portion of the metal via structure comprises a first portion that contacts the insulating layer and a second portion that contacts the lower surface of the upper portion of the metal via structure.

19. The integrated circuit device of claim 14, wherein the insulating layer is on a sidewall of the lower portion of the metal via structure and a sidewall of the upper portion of the metal via structure.

20. The integrated circuit device of claim 14, wherein a third width of an upper surface of the upper portion of the metal via structure in the horizontal direction is less than a fourth width of a lower surface of the metal line in the horizontal direction.

\* \* \* \* \*